United States Patent
Arai

(10) Patent No.: US 10,097,181 B2
(45) Date of Patent: Oct. 9, 2018

(54) APPARATUS AND METHOD FOR STANDBY CURRENT CONTROL OF SIGNAL PATH

(71) Applicant: Micron Technology, Inc., Boise, ID (US)

(72) Inventor: Tetsuya Arai, Sagamihara (JP)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 15/690,968

(22) Filed: Aug. 30, 2017

(65) Prior Publication Data

US 2017/0366184 A1  Dec. 21, 2017

Related U.S. Application Data

(63) Continuation of application No. 15/006,646, filed on Jan. 26, 2016, now Pat. No. 9,780,786.

(51) Int. Cl.
 *H03K 17/16* (2006.01)
 *H03K 19/00* (2006.01)
 *H03K 19/003* (2006.01)

(52) U.S. Cl.
 CPC ..... *H03K 19/0013* (2013.01); *H03K 19/0016* (2013.01); *H03K 19/00384* (2013.01)

(58) Field of Classification Search
 CPC ........... H03K 19/0013; H03K 19/0016; H03K 19/00384
 USPC .......................................................... 326/21
 See application file for complete search history.

(56) References Cited

U.S. PATENT DOCUMENTS

| | | | |
|---|---|---|---|
| 5,828,234 A | 10/1998 | Sprague | |
| 6,208,171 B1 | 3/2001 | Kumagai et al. | |
| 6,292,015 B1 | 9/2001 | Ooishi et al. | |
| 6,384,623 B1 | 5/2002 | Sakata et al. | |
| 6,433,584 B1 | 8/2002 | Hatae | |
| 6,570,407 B1* | 5/2003 | Sugisawa | G01R 31/31854 326/16 |
| 6,635,934 B2 | 10/2003 | Hidaka | |
| 6,917,221 B2* | 7/2005 | Bernstein | H03K 19/01728 326/15 |
| 7,266,707 B2* | 9/2007 | Ngo | G06F 1/3228 257/207 |
| 7,391,233 B1 | 6/2008 | Bose et al. | |
| 2007/0103195 A1 | 5/2007 | Duk-Sohn et al. | |
| 2009/0102508 A1* | 4/2009 | Agarwal | G06F 11/24 326/16 |
| 2013/0257480 A1* | 10/2013 | Kim | H03K 19/0963 326/98 |
| 2017/0214403 A1 | 7/2017 | Arai et al. | |

OTHER PUBLICATIONS

U.S. Appl. No. 15/006,646, entitled: "Apparatus and Method for Standby Current Control of Signal Path", filed Jan. 26, 2016.

* cited by examiner

*Primary Examiner* — Don Le
(74) *Attorney, Agent, or Firm* — Dorsey & Whitney LLP

(57) ABSTRACT

Apparatuses and methods for standby current control of a signal path in a semiconductor device are described. An example apparatus includes: first and second logic gates coupled in series; a first circuit coupled between the first logic gate and a power supply line that activates the first logic gate responsive to a first control signal; and a second circuit coupled between the second logic gate and the power supply line that activates the second logic gate responsive to a second control signal that is different from the first control signal.

17 Claims, 13 Drawing Sheets

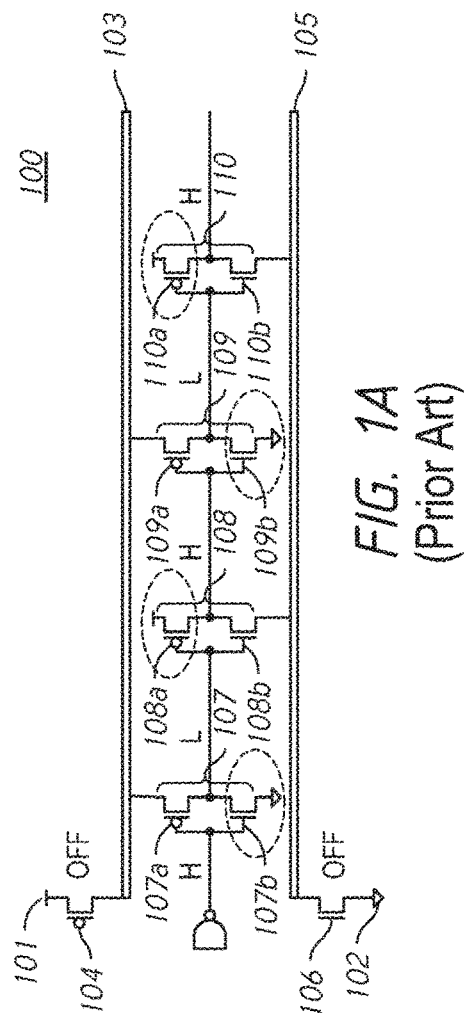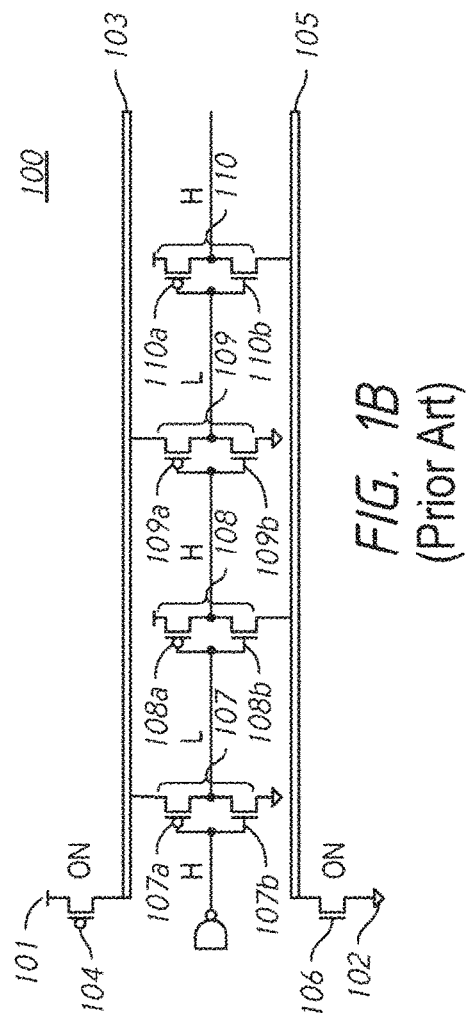

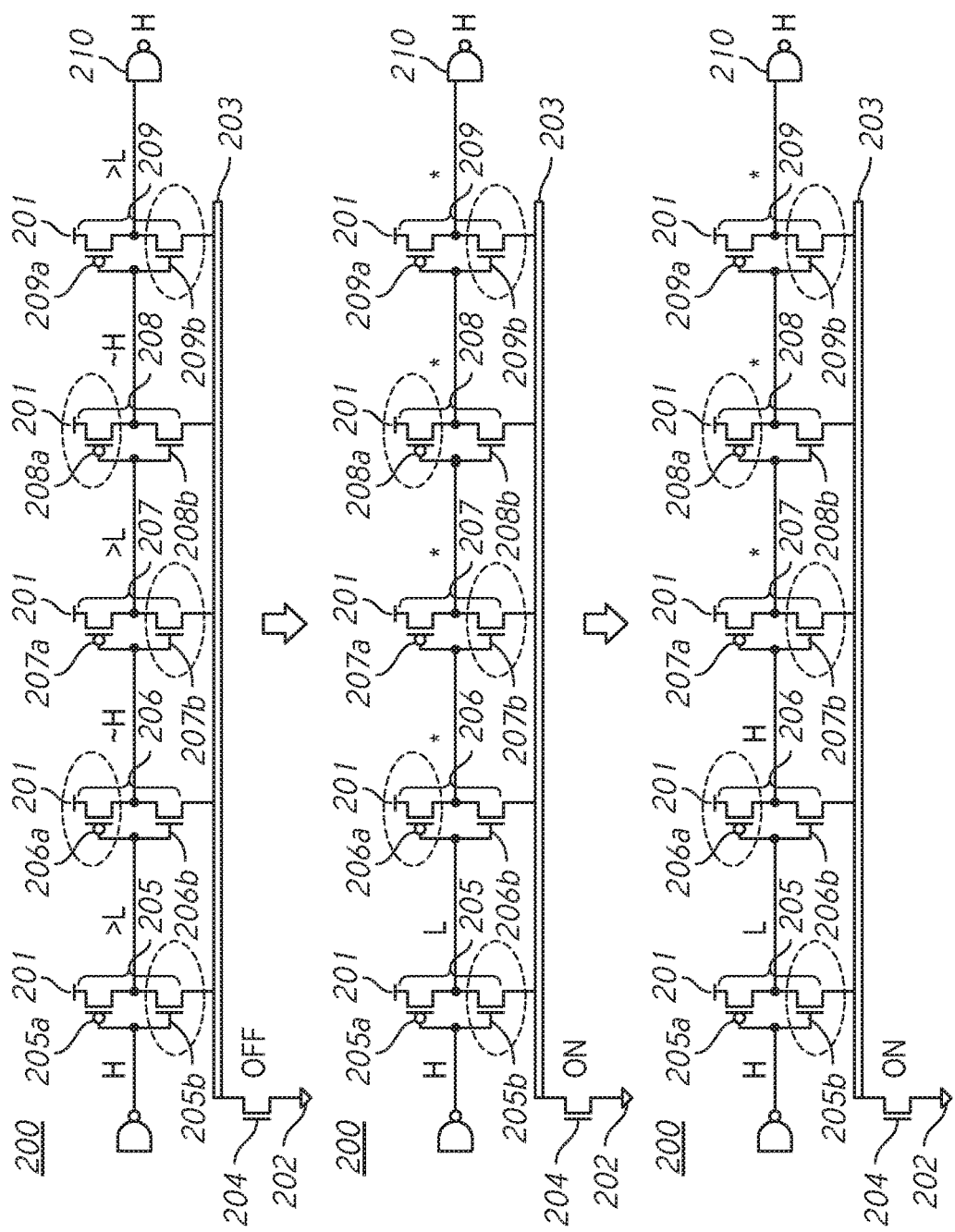

APPARATUS AND METHOD FOR STANDBY CURRENT CONTROL OF SIGNAL PATH

CROSS REFERENCE TO RELATED APPLICATION(S)

This application is a continuation of pending U.S. patent application Ser. No. 15/006,646 filed Jan. 26, 2016, issued as U.S. Pat. No. 9,780,786 on Oct. 3, 2017. The aforementioned application and patent are hereby incorporated herein by reference, in their entirety, for any purpose.

BACKGROUND

High speed of memory access, and reduced power consumption are features that are demanded from semiconductor devices. In recent years, there has been an effort to reduce power consumption and increase access speed for semiconductor devices. As part of that effort to reduce power consumption, it may be desirable to reduce a standby current of buffers on long signal lines used for signal transmission throughout a semiconductor device. For example, systems may include a transistor having a high threshold voltage (Vth) along with these signal lines in order to disconnect a path of a leak current.

For example, U.S. Pat. No. 6,292,015 describes a buffer implemented as an apparatus including sub-threshold current reduction circuits (SCRC). One example of the SCRC is a circuit having a combination of two channel types of transistors for turning off currents. FIGS. 1A and 1B are schematic diagrams of an example buffer 100 including the SCRC in a semiconductor device. The apparatus includes a first power-supply terminal 101, a first ground terminal 102, a second power-supply terminal (pull-up source) 103 that is driven by a first switching transistor 104 and a second ground terminal (pull-down source) 105 that is driven by a second switching transistor 106. In FIG. 1A, the buffer 100 also includes first to fourth logic gates 107, 108, 109 and 110. The second power-supply terminal 103 and the second ground terminal 105 are coupled to the first to fourth logic gates 107, 108, 109 and 110 in a manner that the first power-supply terminal 101 and the first ground terminal 102 are capable of reducing currents in a standby state and driving logic circuits of the first to fourth logic gates 107, 108, 109 and 110 on a signal path after a reset operation. The first switching transistor 104 and the second switching transistor 106 receive first signals in the beginning of the standby state and are deactivated responsive to the first signals. The first switching transistor 104 and the second switching transistor 106 receive second signals when the buffer 100 is reset from the standby state to an active state, and the logic circuits in the first to fourth logic gates 107, 108, 109 and 110 are activated responsive to the second signals. For example, when sources of n-channel transistors 108*b* and 110*b* coupled to the second ground terminal 105 are decoupled from the first ground terminal 102 and change to a floating state, a potential of the floating second ground terminal 105 increases due to subthreshold leakage of currents of the n-channel transistors 108*b* and 110*b*. As a result, gate-source voltages ($V_{GS}$) of the n-channel transistors 108*b* and 110*b* become negative and automatically end the subthreshold leakage of currents. Thus, the potential of the floating second ground terminal 105 stops increasing. As shown in FIGS. 1A and 1B, logic levels of input and output nodes of the first to fourth logic gates 107, 108, 109, and 110 during the standby state are maintained after transition to the active state during a reset operation in FIG. 1B. Moreover, by operations of the logic gates, the potentials of the floating second power-supply terminal 103 and second ground terminal 105 during the standby state are also maintained until a reset operation. Therefore, the reset operation from the standby state may be accelerated.

In recent years, deterioration of MOS transistors due to negative bias temperature instability (NBTI) has become a critical issue. In particular, NBTI deterioration may cause an absolute value of a threshold voltage (|Vth|) of a p-channel MOS transistor to increase according to an increase of a temperature of the p-channel MOS transistor while a gate of the p-channel MOS transistor is negatively biased. The same issue may occur to an n-channel MOS transistor having its gate positively biased. However, the deterioration of the p-channel MOS transistor is salient. Because a p-channel MOS transistor that is active for a substantially long time tends to have the NBTI deterioration, the NBTI deterioration can be a concern to a p-channel MOS transistor being active during the standby state, which may last a long time. In FIG. 1A, as p-channel transistors 108*a* and 110*a* stay active in the standby state, the p-channel transistors 108*a* and 110*a* are more likely to deteriorate, and the threshold voltages (Vth) of the p-channel transistors 108*a* and 110*a* are likely to increase. This NBTI deterioration may result in critical access path deterioration due to propagation delays of data and deviation in duty cycles and skews when the data are maintained as in the standby mode. As described above, the SCRC is subject to the NBTI and thus may not be suitable for a current reduction circuit in an access path. For example, semiconductor products may be easily and excessively damaged by test stress voltages in a burn-in process during manufacturing. Thus, a countermeasure circuit for the NBTI deterioration particularly for use in the burn-in process may be desired.

U.S. Pat. No. 6,433,584 discloses a buffer implemented as an apparatus including countermeasure circuits for the NBTI issue described the above. FIGS. 2A, 2B and 2C are schematic diagrams of another example of a buffer 200 in a semiconductor device, including the countermeasure circuits. The buffer 200 includes a first ground terminal 202 and a second ground terminal 203 that is driven by a switching transistor 204. The buffer 200 also includes a first logic gate 205, a second logic gate 206, a third logic gate 207, a fourth logic gate 208 and a fifth logic gate 209, including respective p-channel transistors 205*a*, 206*a*, 207*a*, 208*a* and 209*a* coupled to power-supply terminals 201 and respective n-channel transistors 205*a*, 206*a*, 207*a*, 208*a* and 209*a* coupled to the second ground terminal 203. During a standby state, the switching transistor 204 is off. The switching transistor 204 receives the second signal when the buffer 200 is reset from the standby state to an active state and activates the first to fifth logic gates 205, 206, 207, 208 and 209 responsive to the second signal. For example, the currents in the buffer 200 may eventually be stabilized due to a subthreshold leakage current limitation of the switching transistor 204, therefore the buffer 200 is still effective in current reduction. As shown in FIG. 2A, a first p-channel transistor 205*a* is turned off and a first n-channel transistor 205*b* is turned on, when an input signal of the first logic gate 205 is constant at a logic high (H) level. Consequently, gates of transistors 206*a* and 206*b* are coupled to the second ground terminal 203 in a floating state with a potential higher than a logic low level, since a potential of an input signal of the second logic gate 206 may be determined by a balance between a cut-off current of the first p-channel transistor 205*a* and a cut-off current of the switching transistor 204. Due to a large threshold voltage (Vth) of the switching transistor 204, a potential of the input node of the second logic gate 206 may be set to an intermediate potential higher than a logic low level (>L). Consequently, a second p-channel transistor 206a is almost activated and the potential of an input node of the third logic gate 207 is set to a logic level of substantially high (~H). In FIG. 2A, first, third and fifth n-channel transistor 205b, 207b and 209b whose gates are substantially at the logic high level, and second, and fourth p-channel transistor 206a and 208a whose levels at gates are higher than the logic low level may have the gate-source voltage ($|V_{GS}|$) reduced, and thus stresses due to the NBTI may be reduced. Unlike the buffer 100 of FIGS. 1A and 1B, however, logic levels of input nodes of the third logic gate 207, the fourth logic gate 208 and the fifth logic gate 209 may not be stabilized immediately. This causes an issue in the reset operation. FIG. 2B is the schematic diagram when the buffer 200 is in transition from the standby state to an active state due to the reset operation and the switching transistor 204 is turned on. Because the source of the first n-channel transistor 205b is coupled to the first ground terminal 202, the input node of the second logic gate 206 is set to the logic low (L) level. The remaining input nodes of the third to fifth logic gates 207, 208 and 209 may not be stabilized until output signals from prior logic gates coupled to the remaining input nodes are stabilized. FIG. 2C is the schematic diagram when the buffer 200 is in transition from the standby state to the active state due to the reset operation, showing a second transition upon reflecting the first transition of FIG. 2B. A gate of the second logic gate 206 receives a logic low (L) signal. Because a potential of the gate of the second n-channel transistor 206b is logic low, the second n-channel transistor 206b is turned off. At the same time, a potential of the gate of the second p-channel transistor 206a is logic low, the second p-channel transistor 206a is turned on and provides a signal of a logic high level to the input node of the third logic gate 207. The remaining input nodes of the fourth and fifth logic gates 208 and 209 may not be stabilized until output signals from logic gates coupled to the remaining input nodes are stabilized. From FIGS. 2B and 2C, transitions from the standby state to the active state including transmission of logic levels after resetting takes a significant amount of time, and gates of the transistors keep oscillating until being stabilized. Thus, there may be considerable power consumption due to the oscillation until logic levels of the input nodes are stabilized. The above-mentioned oscillation is so called a metastable state. As known, a period of metastable state may be extended due to deviation in a PN ratio, process voltage temperature (PVT) variation or the degree of symmetry of a circuitry design. Due to the propagation delay during the oscillation of logic levels on a path, the buffer 200 is less suitable for a signal path with large-scale logical stages. Moreover, the buffer 200 may fail to completely turn off the second and fourth p-channel transistors 206a and 208a in the standby state, thus the deterioration due to the NBTI may still remain, even if reduced.

U.S. Pat. No. 7,391,233 discloses another buffer implemented as an apparatus including countermeasure circuits for the NBTI issue. FIGS. 3A, 3B and 3C are schematic diagrams of another example of a buffer 300 in a semiconductor device. This circuit includes a first ground terminal 302 and a second ground terminal (pull-down source) 304 to be driven by a switching transistor 305 and a precharging transistor 303. Sources of n-channel transistors 306b, 307b, 308b, 309b and 310b are coupled to the second ground terminal 304. In transition to a standby state from an active state, the switching transistor 305 is turned off and the precharging transistor 303 is turned on, thus all the potentials in the buffer 300 are set substantially to the logic high level (~H) and the current consumption may be reduced, if a subthreshold leakage current of the switching transistor 305 is small. During a reset operation in transition to the active state, the switching transistor 305 is turned on and the precharging transistor 303 is turned off, thus first to fifth logic gates 306, 307, 308, 309 and 310 are activated. In FIG. 3A, since potentials of input nodes of the first to fifth logic gates 306, 307, 308, 309 and 310 are set to substantially the same level of the logic high level, the first to fifth p-channel transistors 306a, 307a, 308a, 309a and 310a are substantially turned off and the NBTI deterioration can be remedied. The precharging transistor 303 can be deteriorated due to its being active during the standby state, however this deterioration of the precharging transistor 303 can be tolerated. Because the precharging transistor 303 is not on a signal path, the deterioration of the precharge transistor 303 does not contribute to a propagation delay. Being at the logic high level during the standby state, however, the potentials of the input nodes of the first to fifth logic gates 306, 307, 308, 309 and 310 in the buffer 300 may oscillate in a reset operation transitioning from the standby state to the active state that is represented by asterisk (*), even more easily than the potentials of the input nodes of the circuits in the buffer 200 described earlier with FIGS. 2A-2C. Thus, the buffer 300 may not be suitable for a signal path with large-scale logical stages.

BRIEF DESCRIPTION OF THE DRAWINGS

FIGS. 1A and 1B are schematic diagrams of an example of a buffer in a semiconductor device.

FIGS. 2A, 2B and 2C are schematic diagrams of another example of a buffer in a semiconductor device.

DETAILED DESCRIPTION OF PREFERRED EMBODIMENTS

Reduced chip size, lowered power consumption and high speed of memory access are features demanded from semiconductor devices. Reducing a standby current of buffers on long signal lines used for signal transmission throughout a semiconductor device may lower power consumption. SCRC has been used to reduce standby current. As earlier discussed, the SCRC, however, introduced issues due to the NBTI. Thus, buffers with advantages of the SCRC and less susceptible to issues related to the NBTI are desired.

Various embodiments of the present disclosure will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structure, logical and electrical changes may be made without departing from the scope of the present invention. The various embodiments disclosed herein are not necessary mutually exclusive, as some disclosed embodiments can be combined with one or more other disclosed embodiments to form new embodiments.

Figure 4A:
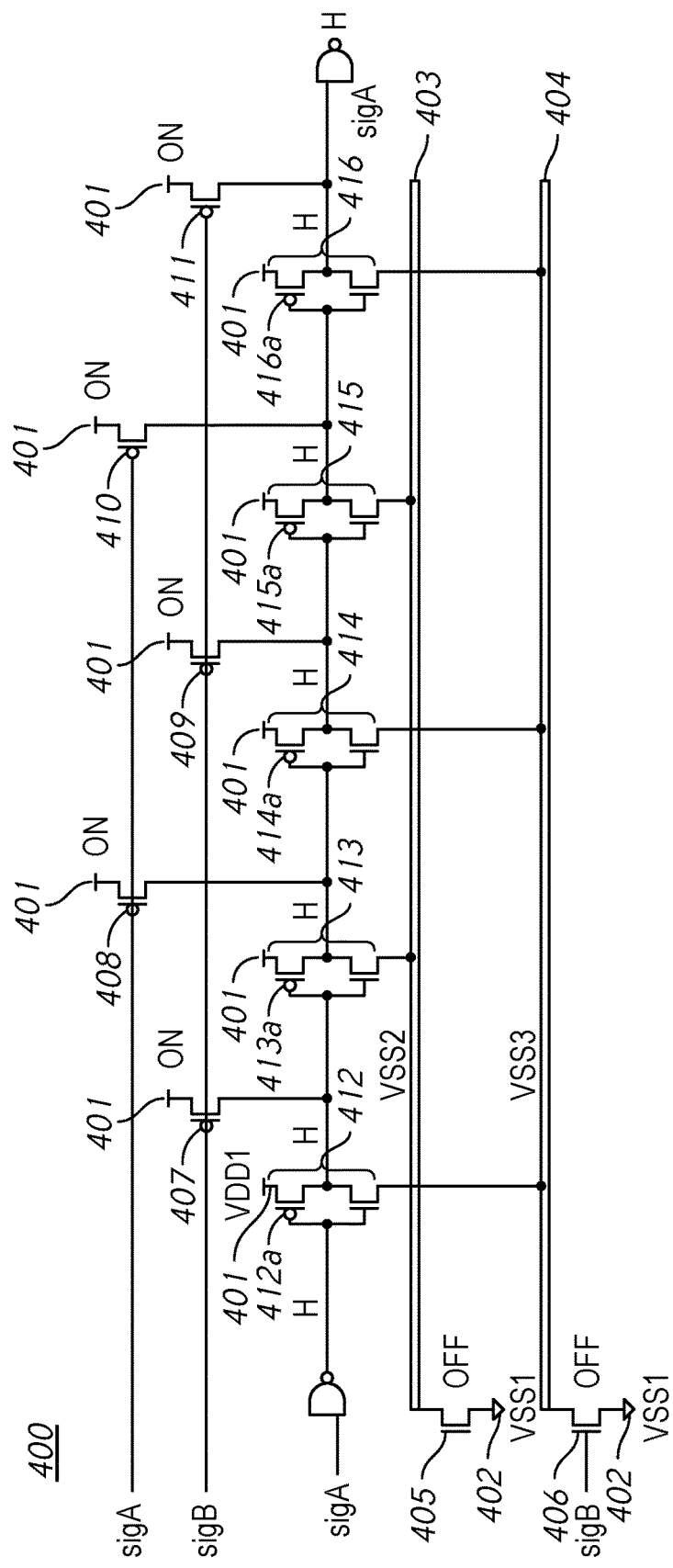
FIGS. 4A-4C are schematic diagrams of an example of a buffer in a semiconductor device, according to an embodiment of the present disclosure.
Figure 4B:
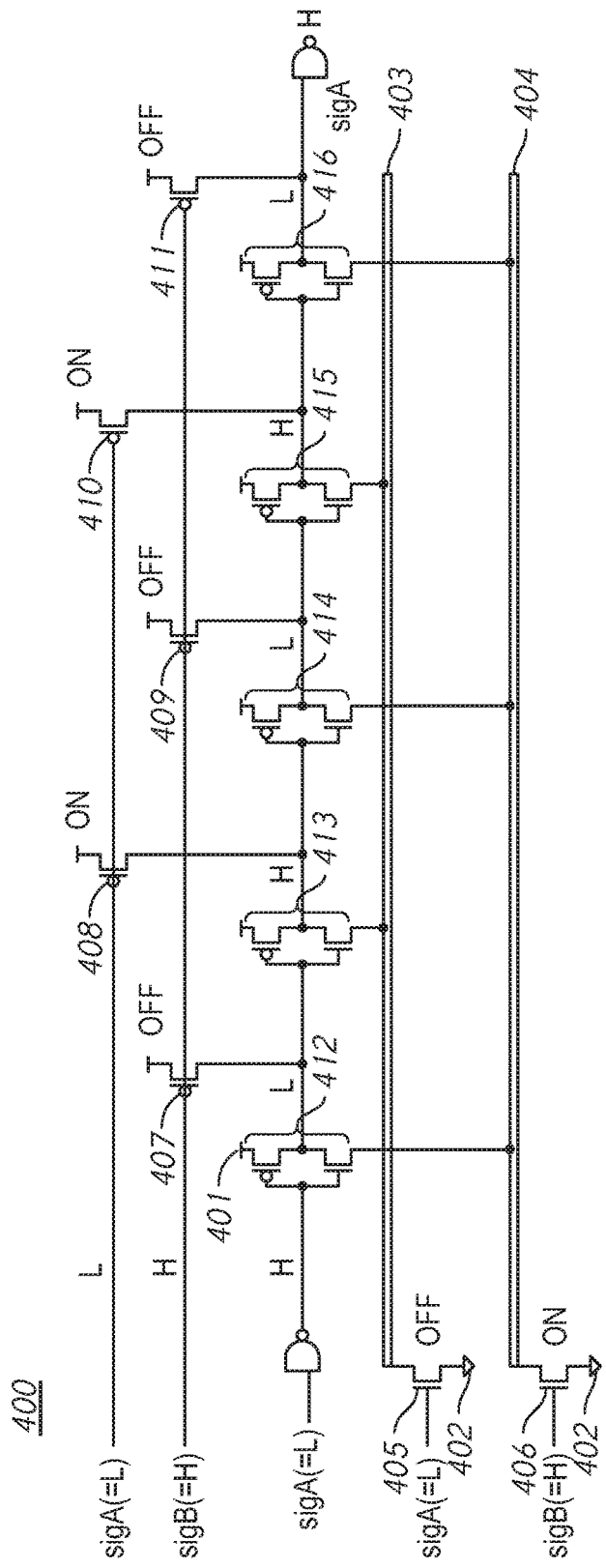
Figure 4C:
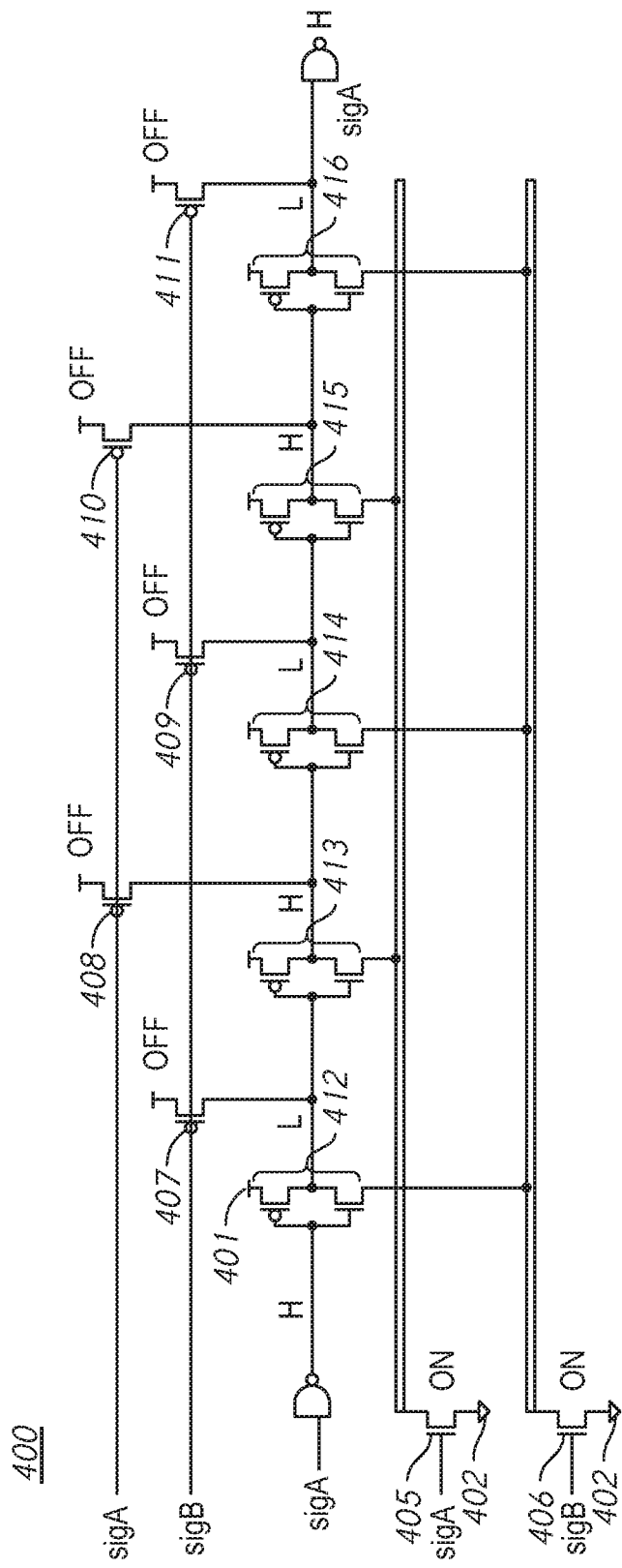

FIGS. 4A-4C are schematic diagrams of an example of a buffer 400 in a semiconductor device, according to an embodiment of the present disclosure. The buffer 400 includes at least one power supply terminal (VDD1) 401 for providing a power potential, at least one first ground potential terminal (VSS1) 402 for providing a ground potential, a second ground potential terminal (VSS2) 403 and a third ground potential terminal (VSS3) 404. The second ground potential terminal (VSS2) 403 may be used as a pull-down source that is driven by a first switching transistor 405. The first switching transistor 405 is coupled between the second ground potential terminal 403 and the first ground potential terminal 402 and further controlled by a first control signal (sigA). The third ground potential terminal (VSS3) 404 is driven by a second switching transistor 406. The second switching transistor 406 is coupled between the third ground potential terminal 404 and the first ground potential terminal 402 and controlled by a second control signal (sigB). Second and fourth precharging transistors 408 and 410 controlled by the sigA are coupled to input nodes of third and fifth logic gates 414 and 416, respectively. First, third and fifth precharging transistors 407, 409 and 411 controlled by the sigB are coupled to input nodes of second and fourth logic gates 413 and 415 and an output node of a fifth logic gate 416, respectively.

In a standby state shown in FIG. 4A, logic levels of sigA and sigB are both logic low. As a result, the first and second switching transistors 405 and 406 are turned off, and first to fifth precharging transistor 407, 408, 409, 410 and 411 are turned on. Thus, gates of first to fifth p-channel transistors 412a, 413a, 414a, 415a and 416a are set to a logic high level to turn off the first to fifth p-channel transistors 412a, 413a, 414a, 415a and 416a. Thus, deterioration due to the NBTI to the first to fifth p-channel transistors 412a, 413a, 414a, 415a and 416a on a signal path can be prevented and power consumption can be reduced.

In a first reset operation, as shown in FIG. 4B, a logic level of sigA is set to low and a logic level of sigB is set to high. Thus the first, third and fifth precharging transistors 407, 409 and 411 controlled by sigB is turned off and the second switching transistor 406 controlled by sigB is turned on. In the meanwhile, the second and fourth precharging transistors 408 and 410 controlled by the sigA are still turned on and the first switching transistor 405 controlled by the sigA is still turned off. Thus, input nodes of logic gates 412, 413, 414, 415 and 416 are reset to respective known logic levels.

In a second reset operation of FIG. 4C, following the first reset operation of FIG. 4B, the logic level of sigA and the logic level of sigB are both set to high. The second and fourth precharging transistors 408 and 410 controlled by sigA are turned off and the first switching transistor 405 controlled by sigA is turned on.

Thus, an entire reset process from the standby state (FIG. 4A) including the first reset operation (FIG. 4B) and the second reset operation (FIG. 4C) is completed. Since the first to fifth precharging transistors 407, 408, 409, 410 and 411 are not on a signal path, the NBTI deterioration of these precharging transistors can be tolerable. In other words, the buffer 400 can be described as a combination of NAND complex gates 412, 414 and 416 controlled by sigA and NAND complex gates 413 and 415 controlled by sigB, which are alternately disposed.

Figure 5:
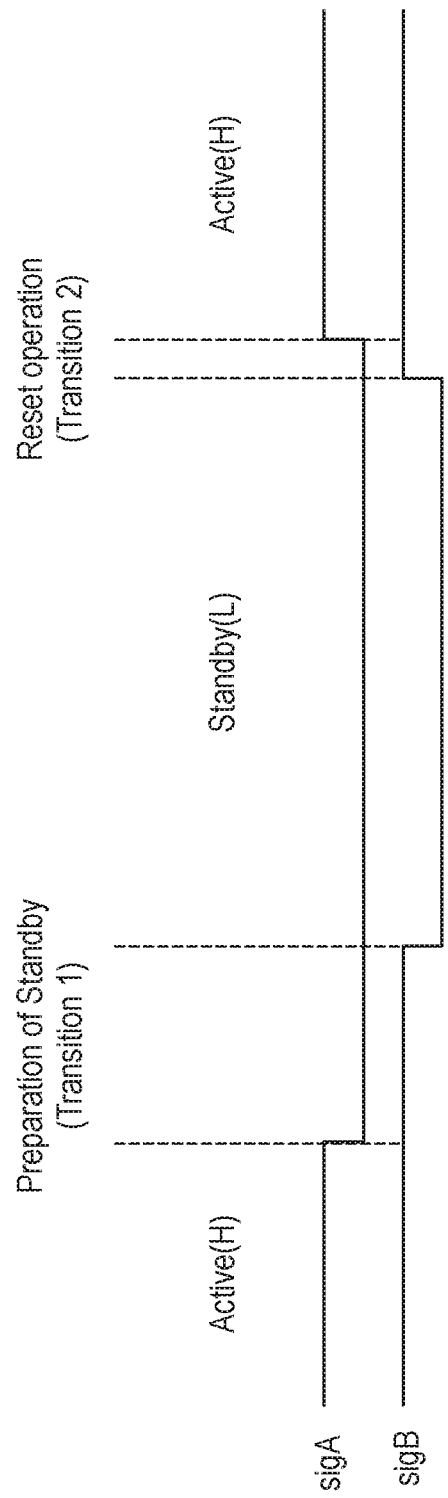
FIG. 5 is a timing diagram of standby control signals for the buffer in FIGS. 4A-4C, according to an embodiment of the present disclosure.

FIG. 5 is a timing diagram of standby control signals for the buffer in FIGS. 4A-4C, according to an embodiment of the present disclosure. A first transition from an active state to a standby state and a second transition (a reset operation) from the standby state to the active state both go through an intermediate state where a signal sigA is logic low level and a signal sigB is logic high level. In the first transition, the signal sigB is set to logic low level after the signal sigA has been set to logic low level. In the second transition, the level of the signal sigA is set to logic high level after the signal sigB has been set to logic high level. In the first transition to the standby state, potentials of logic gates changes to potentials of the standby state, logic high level, in a stable manner, while the potentials of the logic gates can have alternating logic high and logic low levels. In the second transition from the standby state, the reset operation may be executed rapidly with a delay limited to one logic stage.

Figure 6A:
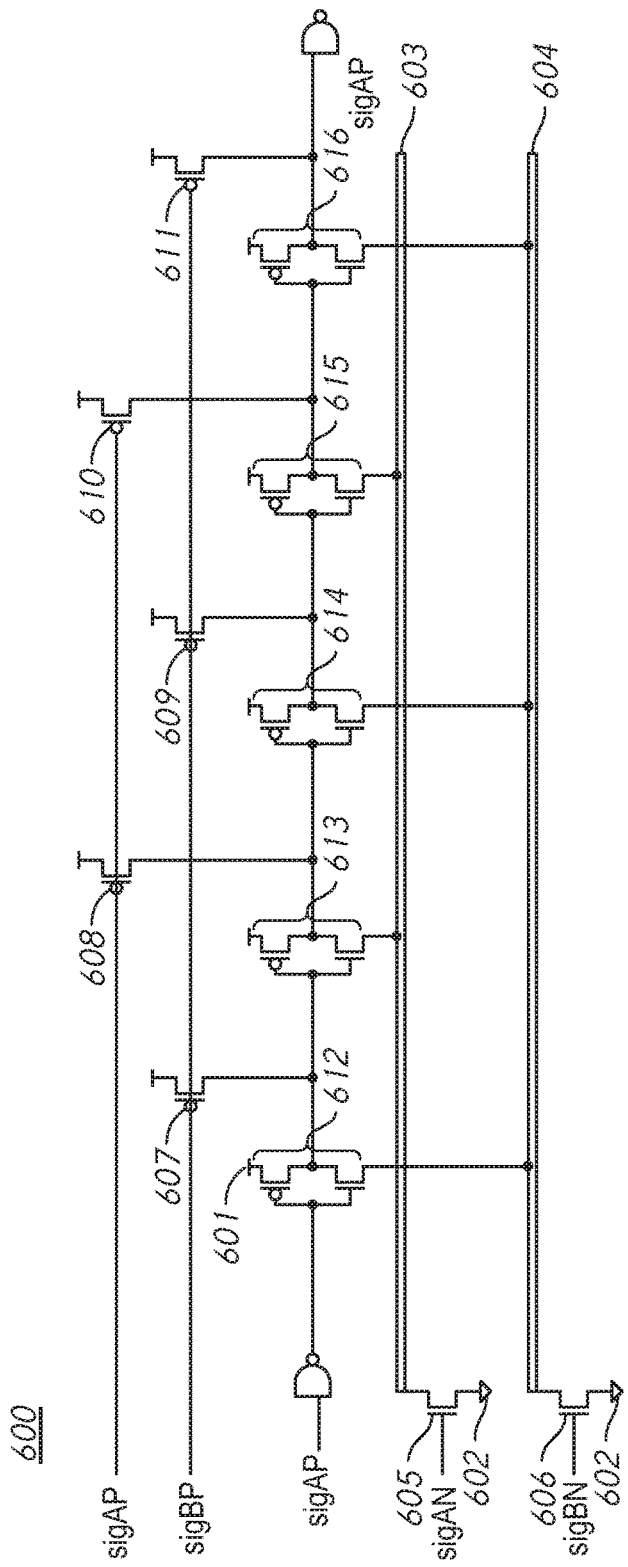
FIG. 6A is a schematic diagram of an example of a buffer in a semiconductor device, according to an embodiment of the present disclosure.
Figure 6B:
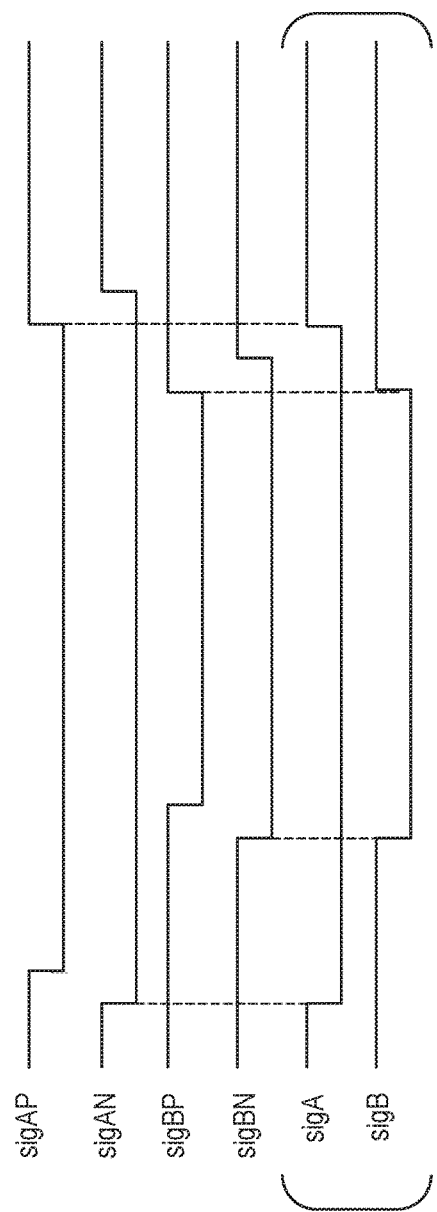
FIG. 6B is a timing diagram of standby control signals for the buffer in FIG. 6A, according to an embodiment of the present disclosure.
Figure 6C:
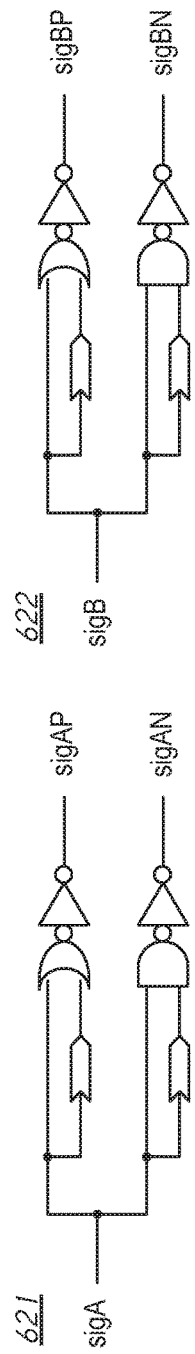
FIG. 6C are schematic diagrams of examples of circuits providing standby control signals for the buffer in FIG. 6A, according to an embodiment of the present disclosure.

FIG. 6A is a schematic diagram of an example of a buffer 600 in a semiconductor device, according to an embodiment of the present disclosure. The buffer 600 provides a first derivative control signal (sigAP) and a second derivative control signal (sigAN) from a sigA when the identical signal sigA may not be used for driving a switching transistor 605 and precharging transistors 608 and 610. Similarly, the buffer 600 also provides a third derivative control signal (sigBP) and a fourth derivative control signal (sigBN) from a sigB when the identical signal sigB may not be used for driving a switching transistor 606 and precharging transistors 607, 609 and 611. FIG. 6B is a timing diagram of standby control signals for the buffer in FIG. 6A, according to an embodiment of the present disclosure. When entering the standby state by the first transition, precharging transistors need to be turned on after turning off respective switching transistors in order to prevent a through current. For example, with regards to sigA, second and fourth precharging transistors 608 and 610 are turned on responsive to sigAP after turning off a respective switching transistor 605 responsive to sigAN. Similarly, with regards to sigB, first, third and fifth precharging transistors 607, 609 and 611 are turned on responsive to the third derivative control signal (sigBP) after turning off a respective switching transistor 606 responsive to the fourth derivative control signal (sigBN). In the reset operation, the switching transistors need to be turned on after turning off the respective precharging transistors. As described above, the buffer 600 is able to prevent a through current. FIG. 6C includes schematic diagrams of an example of circuits providing standby control signals for the buffer in FIG. 6A, according to an embodiment of the present disclosure. A first derivative control signal circuit 621 provides sigAP and sigAN from sigA. A second derivative control signal circuit 622 provides sigBP and sigBN from sigB. The first and second derivative control signal circuits 621 and 627 may be included in either an earlier stage of the buffer 600 or in a standby control circuit later described in this disclosure.

Figure 7:
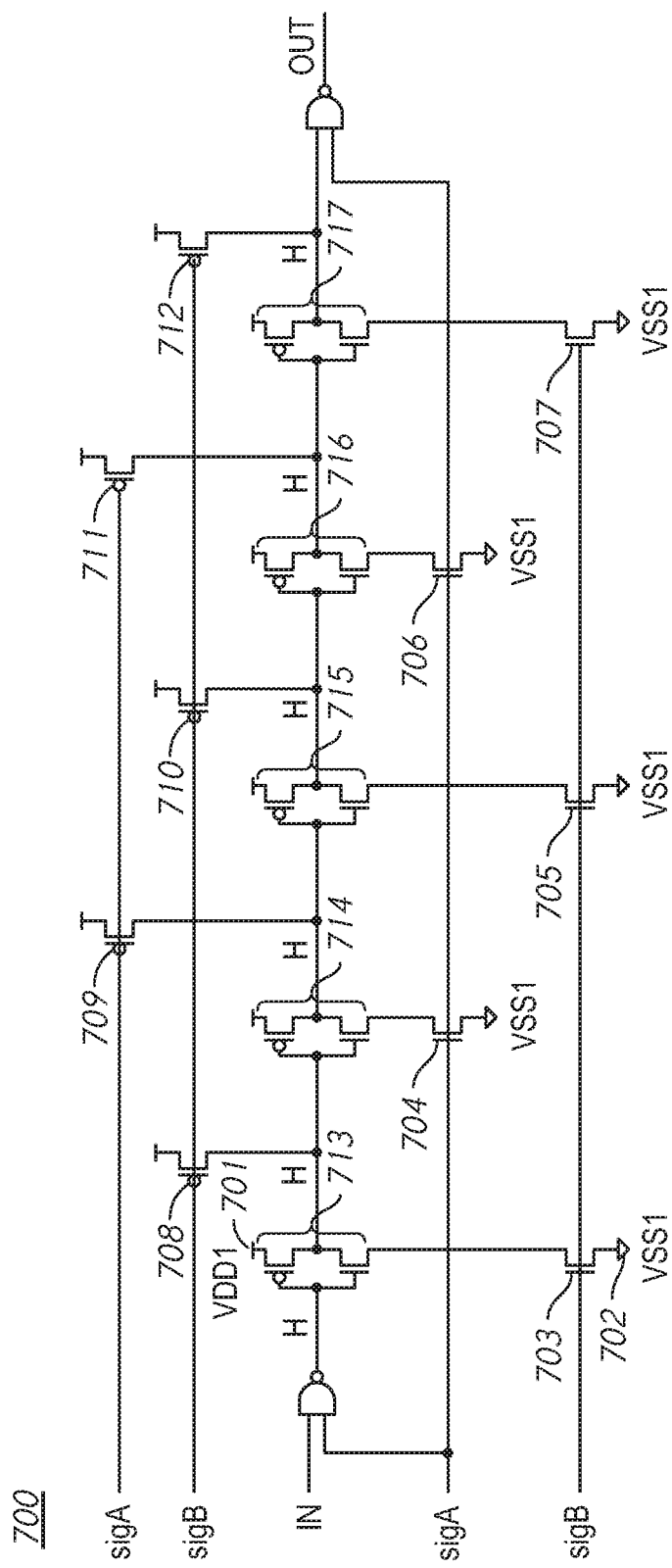
FIG. 7 is a schematic diagram of an example of a buffer in a semiconductor device, according to an embodiment of the present disclosure.

FIG. 7 is a schematic diagram of an example of a buffer 700 in a semiconductor device, according to an embodiment of the present disclosure. The buffer 700 includes a power potential (VDD1) 701 and a ground potential (VSS1) 702. The ground potential (VSS1) 702 may be used as a pull-down source driven by first to fifth switching transistors 703, 704, 705, 706 and 707. The second and fourth switching transistors 704 and 706 are controlled by a first control signal (sigA) and the first, third and fifth switching transistor 703, 705 and 707 are controlled by a second control signal (sigB). Second and fourth precharging transistors 709 and 711 controlled by the sigA are coupled to input nodes of third and fifth logic gate 715 and 717, respectively. First and third precharging transistors 708 and 710 controlled by the sigB are coupled to input nodes of second and fourth logic gates 714 and 716 respectively. Standby operations and reset operations are essentially the same as these in FIGS. 4A-4C. However, unlike the embodiment of FIGS. 4A-4C, one switching transistor is provided to each logic gate and coupled to each logic circuit, instead of providing one switching transistor of one potential terminal shared by a plurality of logic gates and coupled to a plurality of logic circuits.

Figure 8:
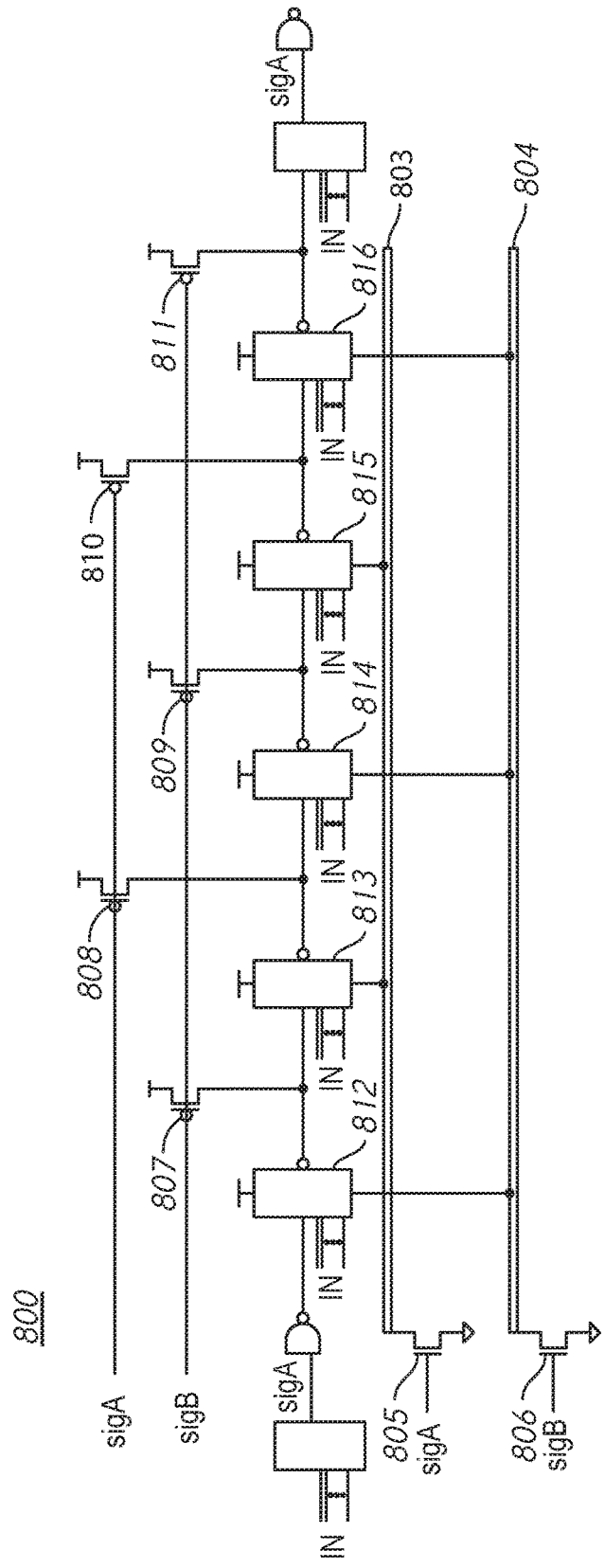
FIG. 8 is a schematic diagram of an example of a buffer in a semiconductor device, according to an embodiment of the present disclosure.

In FIGS. 4A-4C, 6 and 7, a buffer includes NAND complex gates as logic gates, however, the buffer may include another type of logic stages, such as logic circuits. FIG. 8 is a schematic diagram of an example of a buffer 800 in a semiconductor device, according to an embodiment of the present disclosure. Description of components corresponding to components included in FIG. 4A will not be repeated. Logic stages 812, 813, 814, 815 and 816 may be any logic circuits that may function as a buffer to provide a signal path. In FIG. 8, switching transistors 805 and 806 are n-channel transistors. However, the switching transistors may be p-channel transistors instead of n-channel transistors. Similarly, precharging transistors 807, 808, 809, 810 and 811 may be n-channel transistors instead of p-channel transistors. Furthermore, floating sources may be coupled to a power supply (VDD) instead of a ground potential (VSS).

Figure 9:
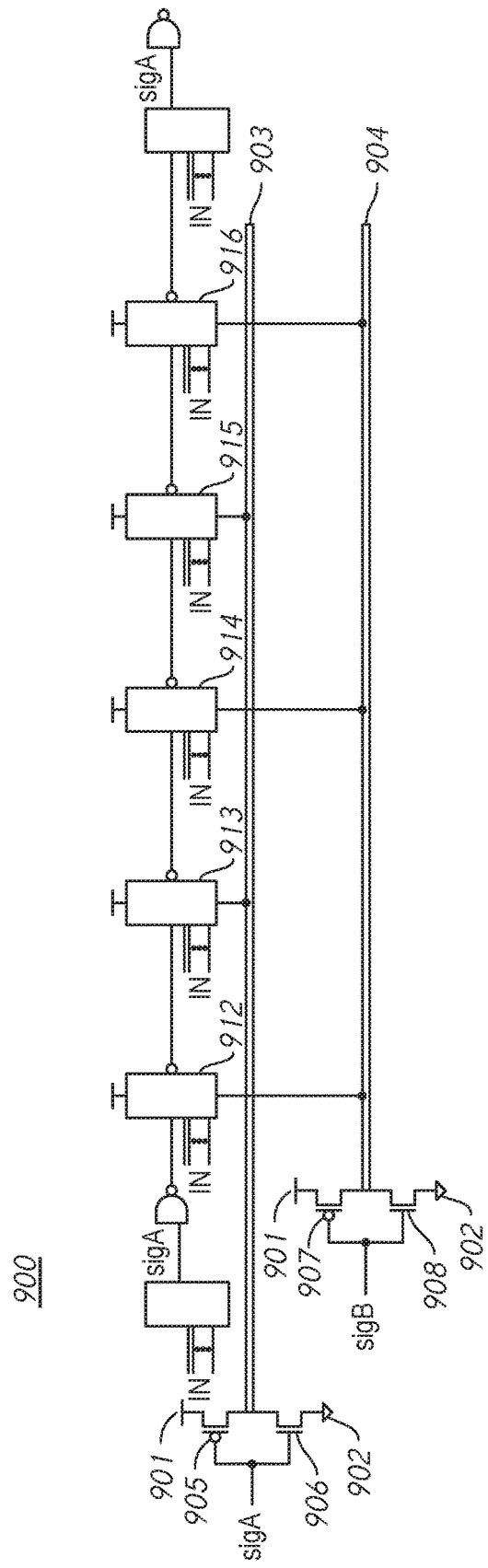
FIG. 9 is a schematic diagram of an example of a buffer in a semiconductor device, according to an embodiment of the present disclosure.

FIG. 9 is a schematic diagram of an example of a buffer 900 in a semiconductor device, according to an embodiment of the present disclosure. The buffer 900 includes a power supply terminal 901, a first ground terminal 902, a second ground terminal (a first pull-down source) 903 and a third ground terminal (a second pull-down source) 904. The second ground terminal 903 may be driven by sigA by way of a first precharging transistor 905 and a first switching transistor 906. The third ground terminal 904 may be driven by sigB by way of a second precharging transistor 907 and a second switching transistor 908. In the buffer 900, a precharging process of intermediate nodes (each gate) of a signal path is executed through a common source (ground terminal). For example, intermediate nodes of logic circuits 912, 914 and 916 are coupled to the third ground terminal 904 and intermediate nodes of logic circuits 913 and 915 are coupled to the second ground terminal 903.

Figures 3A, 3B, 3C:
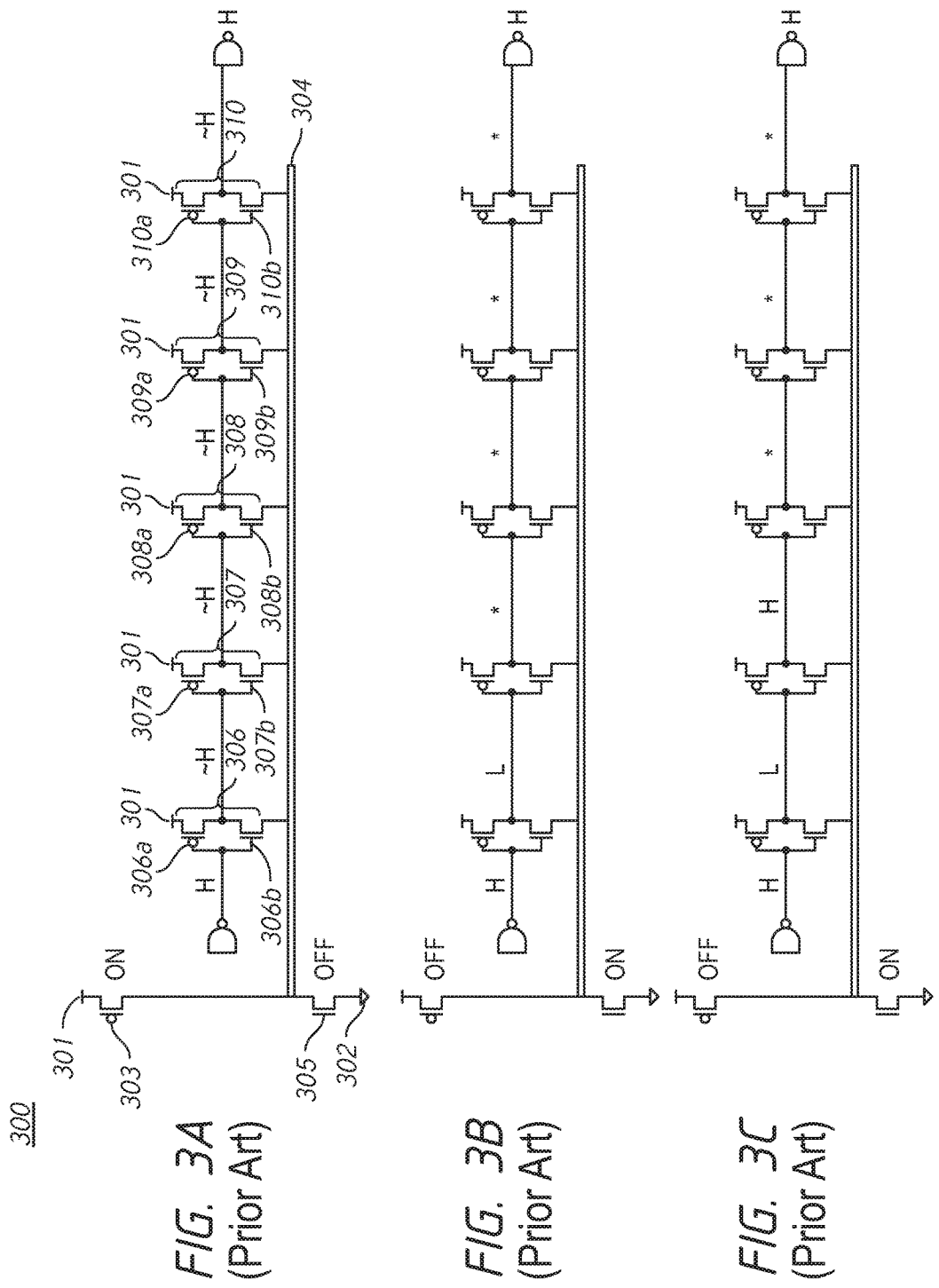
FIGS. 3A, 3B and 3C are schematic diagrams of another example of a buffer in a semiconductor device.

In a standby mode, sigA and sigB are controlled to have a logic low level to provide a power supply (VDD)) to the logic circuits 912, 913, 914, 915 and 916. Thus, output nodes of the logic circuits 912, 913, 914, 915 and 916 are at a logic high level irrespective of levels of input signals of the logic circuits. When entering a reset operation from the standby mode, sigB is set to a logic high level first and sigA still remains at a logic low level in a first step of the reset operation. In the first step, the ground potential (VSS) is supplied to a first group of the logic circuits 912, 914 and 916 coupled to the third ground terminal 904 due to activation of the second switching transistor 908 responsive to the logic high level of sigB. In this first step, a second group of the logic circuits 913 and 915 coupled to the second ground terminal 903 are still pulled up to the power supply (VDD). SigB is activated first in order to stabilize potentials of output nodes of the first group of the logic circuits 912, 914 and 916. By suppressing providing the ground potential (VSS) to the second group of the logic circuits 913 and 915, the first group of the logic circuits 912, 914 and 916 are able to make fast transition of their internal logic levels. If the second group of the logic circuits 913 and 915 also receive the ground potential (VSS), the second group of the logic circuits 913 and 915 provide output signals at the logic low level which are input signals of the first group of the logic circuits 914 and 916. This lowering the levels of the input signals of the first group of the logic circuits 914 and 916 relevant to sigB causes a delay of changing levels. Thus, in the second step, after the first group of the logic circuits 912, 914 and 916 relevant to sigB completes transitioning their output logic levels from the logic high level to the logic low level, sigA is set to the logic high level. P-channel transistors in the logic gates 912, 913, 914, 915 and 916 may have similar defects of the buffer in FIGS. 3A-3C, however, signal lines can be simplified, and an area occupied in a chip may be reduced with relatively controlled power consumption.

Figure 10:
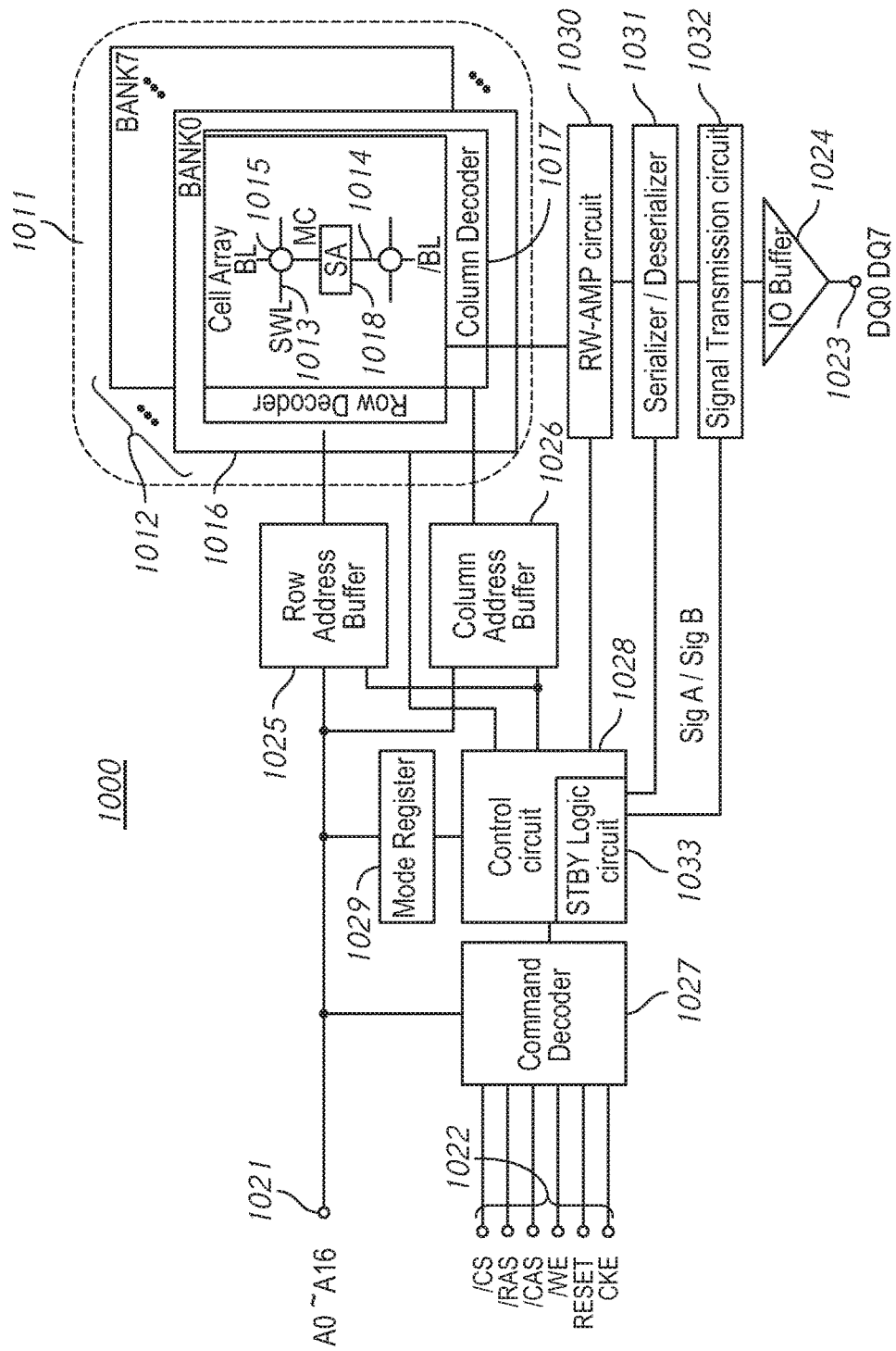
FIG. 10 is a block diagram of an example of a semiconductor device, according to an embodiment of the present disclosure.

FIG. 10 is a block diagram of an example of a semiconductor device 1000, according to an embodiment of the present disclosure. In the embodiment, the semiconductor device 1000 may be a dynamic random access memory (DRAM) integrated into a single semiconductor chip, for example, however, other devices may also be the semiconductor device 1000 of other embodiments of the present disclosure. The semiconductor device 1000 may be mounted on a memory module substrate, a mother board or the like (not shown).

The semiconductor device 1000 includes a memory cell array region 1011 including a plurality of banks 1012, each bank 1012 including a plurality of sub word lines 1013, a plurality of bit lines 1014, and a plurality of memory cells 1015 arranged at intersections of the plurality of sub word lines 1013 and the plurality of bit lines 1014. The selection of the sub word line is performed by a plurality of row decoders 1016 and the selection of the bit line is performed by a plurality of column decoders 1017. Sense amplifiers 1018 are located for their corresponding bit lines. The semiconductor device 1000 further includes address terminals 1021, command terminals 1022, and data terminals 1023. The data terminals 1023 may include data input/output terminals (DQ0-DQ7). Input/output buffers 1024 are coupled to the data terminals 1023. The address terminals 1021 are supplied with address signals (A0-A16), or the like, externally. Among the signals from the address terminals 1021, row address signals can be supplied to the row decoder 1016 via a row address buffer 1025 for selecting a row of a bank. Column address signals obtained from the address terminals 1021 can also be supplied to the column decoder 1017 via a column address buffer 1026. A mode register 1029 is provided to define operating modes for the semiconductor memory device. For example, the mode register is typically used to define clock latency, burst access type and burst access lengths. The command terminals 1022 may include a chip select (CS) pin for receiving a complementary CS signal, a row address strobe (RAS) pin for receiving a complementary RAS signal used to latch a row address, a column address strobe (CAS) pin for receiving a complementary CAS signal used to latch a column address, a write enable (WE) pin for receiving a complementary WE signal to choose a read operation or a write operation, a clock enable (CKE) pin for receiving a CKE signal, a reset (RESET) pin, and the like. A command decoder 1027 decodes command signals from the command terminals 1022 and the address signals from the address terminals 1021 to receive various commands including a read command and a write command, and provides control signals responsive to the received commands to a control circuit 1028. Some of the address information from the address terminals 1021 may be provided to the row address buffer 1025 and the column address buffer 1026 via the command decoder 1027 and the control circuit 1028.

Accordingly, read data is read from a memory cell 1015 in the memory cell array 1012 designated by a row address and a column address, when the read command is issued and the row address and the column address are timely supplied with the read command. The read data is output from the data terminals (DQ0-DQ7) 1023 via a read/write (RW) amplifier circuit 1030, a serializer/deserializer 1031 and the I/O buffers 1024. Similarly, write data supplied to the data terminals 1024 is transmitted via the buffers 1024, the serializer/deserializer 1031 and the R/W amplifier circuit 1030 to the memory cell array 1012 when the write command is issued and the row address and the column address are timely supplied with the write command. The write data is then written to the memory cell 1015 designated by a row address and a column address.

The semiconductor device 1000 may include a signal transmission circuit 1032 between the serializer/deserializer 1031 and the I/O buffers 1024. The signal transmission circuit 1032 transmits data signals or other signals (e.g., address signals, command signals, etc.) and includes a buffer of various embodiments described earlier to provide a signal path of the present disclosure. A standby logic circuit 1033 provides control signals (e.g., sigA and sigB in FIGS. 4A-4C and 5-9). For example, the standby logic circuit 1033 may be included in the control circuit 1028 as shown in FIG. 10; however, the standby logic circuit 1033 may also be placed outside of the control circuit 1028. In one embodiment, the standby logic circuit 1033 may be controlled by a clock enable (CKE) signal received at the CKE pin of the command terminal 1022. When the clock enable signal CKE is set to a logic low level, for example, indicative of an entry to a "Self refresh mode" or a "Power down mode", the standby logic circuit 1033 provides the control signals for controlling transition to a standby state accordingly to the signal transmission circuit 1032. The standby logic circuit 1033 further provides the control signals for controlling transition to an active state accordingly to the signal transmission circuit 1032 when the clock enable signal CKE is set to a logic high level. In another embodiment, the standby logic circuit 1033 may provide the control signals for controlling transition to the standby state to the signal transmission circuit 1032, responsive to a precharge command (PRE) received at the command decoder 1027. The standby logic circuit 1033 may further provide the control signals for controlling transition to the active state, when the command decoder 1027 receives a row active command (ACT) including specific row and bank addresses to access a specific row in a specific bank 1012 of the memory cell array region 1011. The signal transmission circuit 1032 receives the control signals from the standby logic circuit 1033 and changes between the active state and the standby state responsive to the control signals.

As described above, apparatuses and methods for standby current control of a signal path in a semiconductor device, such as buffers in a signal transmission circuit including combinations of precharging transistors and one or more switching transistors, are disclosed. A precharging transistor which tolerates NBTI deterioration during a standby state is disposed on an intermediate node of each logic circuit in the buffer on a signal path. Moreover, a switching transistor is disposed on a source node of each logic circuit in the buffer on the signal path. Because the precharging transistors are disposed outside of the signal path, NBTI deterioration may be acceptable and signal degradation due to NBTI deterioration on the signal path can be prevented. Moreover, power consumption can be reduced and transitions between an active state and a standby state can be accelerated.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

What is claimed is:

1. An apparatus comprising:
an input terminal;
an output terminal; and
a plurality of logic circuits coupled in series between the input terminal and the output terminal, the plurality of logic circuits including a first logic circuit and a second logic circuit;
wherein each of output nodes of the first logic circuit and the second logic circuit is configured to be precharged in a standby state;
wherein, in a first reset operation following the standby state, the first logic circuit is configured to be coupled to the voltage terminal and the output node of the first logic circuit is further configured to be released from being precharged when the second logic circuit is configured to be decoupled to the voltage terminal and when the output node of the second logic circuit is further configured to be still precharged; and
wherein, in a first transition to the standby state, the output node of the second logic circuit is further configured to start being precharged when the output node of the first logic circuit is further configured to be still released from being precharged.

2. The apparatus of claim 1, wherein the output node of the first logic circuit is further configured to be released from being precharged in a second transition, which follows the first transition, to the standby state; and wherein the output node of the second logic circuit is further configured to being precharged in the second transition.

3. The apparatus of claim 1, wherein the second logic circuit is further configured to be coupled to the voltage terminal in a second reset operation following the first reset operation; and
wherein the first logic circuit is further configured to be coupled to the voltage terminal in the second reset operation.

4. The apparatus of claim 2, further comprising a voltage terminal;
wherein the second logic circuit is configured to be decoupled to the voltage terminal in the first transition; and
wherein the first logic circuit is configured to be coupled to the voltage terminal in the first transition.

5. The apparatus of claim 4, wherein the first logic circuit is further configured to be coupled to the voltage terminal in the second transition; and
wherein the second logic circuit is configured to be decoupled to the voltage terminal in the second transition.

6. An apparatus comprising:
an input terminal;
an output terminal; and
a plurality of logic circuits coupled in series between the input terminal and the output terminal such that an output node of a proceeding one of the plurality of logic circuits is coupled to an input node of a succeeding one of the plurality of logic circuits, an input node of a first one of the plurality of logic circuits is coupled to the input terminal and an output node of a last one of the plurality of logic circuits is coupled to the output terminal;
wherein each of output nodes of the plurality of logic circuits are configured to be precharged in a standby state;
wherein each of odd numbered one or ones of output nodes of the plurality of logic circuits is configured to be released from being precharged in a first reset operation following the standby state;
wherein each of even numbered one or ones of output nodes of the plurality of logic circuits is configured to be still precharged in the first reset operation;
wherein each of the even numbered one or ones of output nodes of the plurality of logic circuits is further configured to start being precharged in a first transition to the standby state; and
wherein each of the odd numbered one or ones of output nodes of the plurality of logic circuits is further configured to be still released from being precharged in the first transition.

7. The apparatus of claim 6, wherein each of the even numbered one or ones of output nodes of the plurality of logic circuits is further configured to be released from being precharged in a second reset operation following the first reset operation.

8. The apparatus of claim 7, wherein each of the odd numbered one or ones of output nodes of the plurality of logic circuits is further configured to be released from being precharged in a second transition, which follows the first transition, to the standby state; and
wherein each of the even numbered one or ones of output nodes of the plurality of logic circuits is further configured to being precharged in the second transition.

9. The apparatus of claim 6, further comprising a voltage terminal;
wherein each of the odd numbered one or ones of the plurality of logic circuits is configured to be coupled to the voltage terminal in the first reset operation; and
wherein each of the even numbered one or ones of the plurality of logic circuits is configured to be decoupled to the voltage terminal in the first reset operation.

10. The apparatus of claim 9, wherein each of the even numbered one or ones of the plurality of logic circuits is configured to be coupled to the voltage terminal in a second reset operation following the first reset operation; and
wherein each of the odd numbered one or ones of the plurality of logic circuits is configured to be coupled to the voltage terminal in the second reset operation.

11. The apparatus of claim 7, further comprising a voltage terminal;
wherein each of the even numbered one or ones of the plurality of logic circuits is configured to be decoupled to the voltage terminal in the first transition; and
wherein each of the odd numbered one or ones of the plurality of logic circuits is configured to be still coupled to the voltage terminal in the first transition.

12. The apparatus of claim 11, wherein each of the odd numbered one or ones of the plurality of logic circuits is configured to be coupled to the voltage terminal in the second transition; and
wherein each of the even numbered one or ones of the plurality of logic circuits is configured to be decoupled to the voltage terminal in the second transition.

13. A method comprising:
precharging, in a standby state, each of output nodes of the plurality of logic circuits, the plurality of logic circuits coupled in series such that an output node of a proceeding one of the plurality of logic circuits is coupled to an input node of a succeeding one of the plurality of logic circuits;
stopping precharging, in a first reset operation following the standby state, each of odd numbered one or ones of the output nodes of the plurality of logic circuits;
keeping precharging, in the first reset operation, each of even numbered one or ones of the output nodes of the plurality of logic circuits; and
wherein each of the even numbered one or ones of output nodes of the plurality of logic circuits is further configured to start being precharged in a first transition to the standby state, prior to when each of the odd numbered one or ones of output nodes of the plurality of logic circuits is further configured to start being precharged in the first transition to the standby state.

14. The method of claim 13, further comprising:
stopping precharging, in a second reset operation following the first reset operation, each of even numbered one or ones of the output nodes of the plurality of logic circuits.

15. The method of claim 14, further comprising:
start precharging, in a first transition to the standby state, each of even numbered one or ones of the output nodes of the plurality of logic circuits;
wherein each of odd numbered one or ones of the output nodes of the plurality of logic circuits is still stopped precharging in the first transition.

16. The method of claim 15, further comprising:
stopping precharging, in a second transition which follows the first transition to the standby state, each of odd numbered one or ones of the output nodes of the plurality of logic circuits;

wherein each of even numbered one or ones of the output nodes of the plurality of logic circuits is precharged in the second transition.

17. The method of claim 13, wherein each of the odd numbered one or ones of output nodes of the plurality of logic circuits is further configured to be still released from being precharged in the first transition.

* * * * *